(12) United States Patent
Kim

(10) Patent No.: US 6,566,020 B2
(45) Date of Patent: May 20, 2003

(54) DARK FIELD TRENCH IN AN ALTERNATING PHASE SHIFT MASK TO AVOID PHASE CONFLICT

(75) Inventor: Hung-Eil Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 91 days.

(21) Appl. No.: 09/844,015

(22) Filed: Apr. 27, 2001

(65) Prior Publication Data

US 2002/0160275 A1 Oct. 31, 2002

(51) Int. Cl.$^7$ ............... G03F 9/00; G03C 5/00
(52) U.S. Cl. ................... 430/5; 430/314
(58) Field of Search ............ 430/5, 311, 314, 430/315, 322, 324; 716/19, 21

(56) References Cited

U.S. PATENT DOCUMENTS

| 5,468,578 A | * 11/1995 | Rolfson | 430/5 |
| 5,541,025 A | * 7/1996 | Oi et al. | 430/5 |
| 5,576,126 A | * 11/1996 | Rolfson | 430/5 |

* cited by examiner

*Primary Examiner*—S. Rosasco
(74) *Attorney, Agent, or Firm*—Foley & Lardner

(57) ABSTRACT

A photoresist mask used in the fabrication of an integrated circuit is described. This mask can include a first portion having a phase characteristic; a second portion being located proximate the first portion and having the same phase characteristic as the first portion; and a segment disposed between the first portion and the second portion to prevent phase conflict between the first portion and the second portion.

20 Claims, 6 Drawing Sheets

DARK FIELD TRENCH IN AN ALTERNATING PHASE SHIFT MASK TO AVOID PHASE CONFLICT

FIELD OF THE INVENTION

The present specification relates generally to the field of integrated circuits and to methods of manufacturing integrated circuits. More particularly, the present specification relates to a dark field trench in an alternating phase shift mask to avoid phase conflict.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to put millions of devices on an IC, there is still a need to decrease the size of IC device features, and, thus, increase the number of devices on an IC.

One limitation to the smallness of IC critical dimensions is conventional lithography. In general, projection lithography refers to processes for pattern transfer between various media. According to conventional projection lithography, a silicon slice, the wafer, is coated uniformly with a radiation-sensitive film or coating, the photoresist. An exposing source of radiation (such as light, x-rays, or an electron beam) illuminates selected areas of the surface through an intervening master template, the mask, for a particular pattern. The lithographic coating is generally a radiation-sensitized coating suitable for receiving a projected image of the subject pattern. Once the image is projected, it is indelibly formed in the coating. The projected image may be either a negative or a positive image of the subject pattern.

Exposure of the coating through a photomask or reticle causes the image area to become selectively crosslinked and consequently either more or less soluble (depending on the coating) in a particular solvent developer. The more soluble (i.e., uncrosslinked) or deprotected areas are removed in the developing process to leave the pattern image in the coating as less soluble polymer.

Projection lithography is a powerful and essential tool for microelectronics processing. As feature sizes are driven smaller and smaller, optical systems are approaching their limits caused by the wavelengths of the optical radiation.

Conventional projection lithographic processes are limited in their ability to print small features, such as, contacts, trenches, polysilicon lines or gate structures. As such, the critical dimensions of IC device features, and, thus, IC devices, are limited in how small they can be.

The ability to reduce the size of structures, such as, shorter IC gate lengths depends, in part, on the wavelength of light used to expose the photoresist. In conventional fabrication processes, optical devices expose the photoresist using light having a wavelength of 248 nm (nanometers), but conventional processes have also used the 193 nm wavelength. Further, next generation lithographic technologies may progress toward a radiation having a wavelength of 157 nm and even shorter wavelengths, such as those used in EUV lithography (e.g., 13 nm).

Phase-shifting mask technology has been used to improve the resolution and depth of focus of the photolithographic process. Phase-shifting mask technology refers to a photolithographic mask which selectively alters the phase of the light passing through certain areas of the mask in order to take advantage of destructive interference to improve resolution and depth of focus. For example, in a simple case, each aperture in the phase-shifting mask transmits light 180 degrees out of phase from light passing through adjacent apertures. This 180 degree phase difference causes any light overlapping from two adjacent apertures to interfere destructively, thereby reducing any exposure in the center "dark" comprising an opaque material, such as chrome.

An exemplary phase-shifting mask 10 is illustrated in FIG. 1. Phase-shifting mask 10 includes a transparent layer 12 and an opaque layer 14. Opaque layer 14 provides a printed circuit pattern to selectively block the transmission of light from transparent layer 12 to a layer of resist on a semiconductor wafer. Transparent layer 12 includes trenches 16 which are etched a predetermined depth into transparent layer 12. The light transmitted through transparent layer 12 at trenches 16 is phase-shifted 180 degrees from the transmission of light through other portions of phase-shifting mask, such as portions 18. As the light travels between phase-shifting mask 10 and the resist layer of a semiconductor wafer below (not shown), the light scattered from phase-shifting mask 10 at trenches 16 interferes constructively with the light transmitted through phase-shifting mask 10 at portions 18, to provide improved resolution and depth of focus.

As mentioned, various different wavelengths of light are used in different photolithographic processes. The optimal wavelength of light is based on many factors, such as the composition of the resist, the desired critical dimension (CD) of the integrated circuit, etc. Often, the optimal wavelength of light must be determined by performing a lithography test with photolithographic equipment having different wavelengths. When a phase-shifting mask technique is utilized, two different phase-shifting masks must be fabricated, each mask having trenches 16 suitable for phase-shifting light of the desired wavelength. The fabrication of phase-shifting masks is costly. Further, comparison of the effect of the two different wavelengths printing processes is difficult and requires complex software processing to provide a suitable display.

One difficulty in using phase-shifting mask technologies is phase conflict. Phase conflict arises when two separate areas on a phase-shifting mask have the same phase shift characteristic and are so close in proximity that there is a bridging between the two areas. Bridging, or the effective photo-connection of two separate areas in the mask, results in a less than accurate mask. As such, phase-shifting masks are designed to avoid proximity of areas where the light will have the same phase going through both areas. This design constraint can limit the size and complexity of the phase-shifting mask, and, thus, the pattern on the IC.

Thus, there is a need for an improved phase-shifting mask. Further, there is a need for avoiding phase conflict issues in phase shift masks. Further still, there is a need for a dark field trench in an alternating phase shift mask having a high transmittance area to avoid phase conflict.

SUMMARY OF THE INVENTION

An exemplary embodiment relates to a photoresist mask used in the fabrication of an integrated circuit. This mask can include a first portion having a phase characteristic, a second portion being located proximate the first portion and having the same phase characteristic as the first portion, and a segment disposed between the first portion and the second portion to prevent phase conflict between the first portion and the second portion.

Another exemplary embodiment relates to a photoresist mask configured for use in an integrated circuit fabrication process. This mask can be made by a method including depositing a phase shift material over an opaque layer, and selectively removing the phase shift material except at a location between two phase shift mask portions having the same phase characteristic.

Another exemplary embodiment relates to a phase shifting mask. This phase shifting mask can include a first section with an alternating phase shift characteristic, a second section which is proximate to the first section and has the same alternating phase shift characteristic as the first section, and a third section with a high transmittance attenuating phase shift characteristic being formed at the location of the potential phase conflict section. A potential phase conflict section is located between the first section and the second section.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF EXEMPLARY EMBODIMENTS

Figure 1:
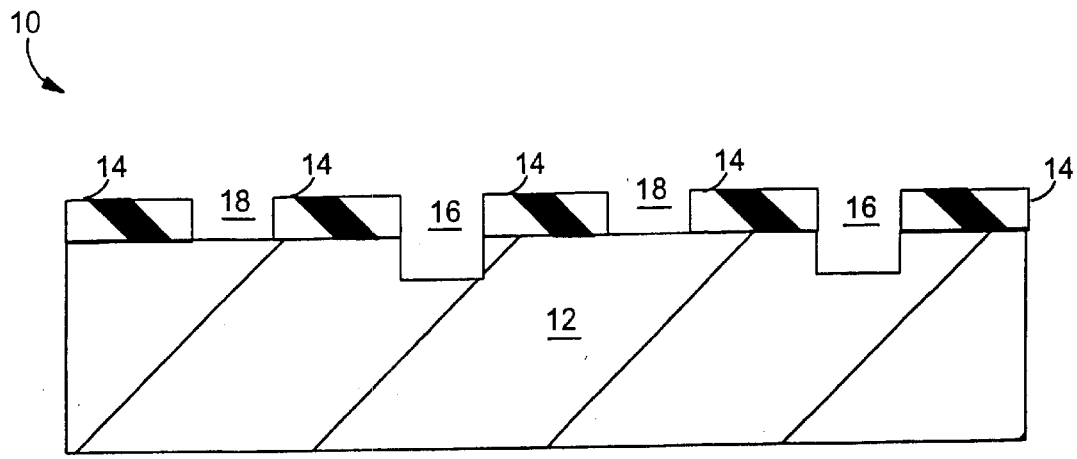
FIG. 1 is an exemplary conventional phase-shifting mask.
Figure 2:
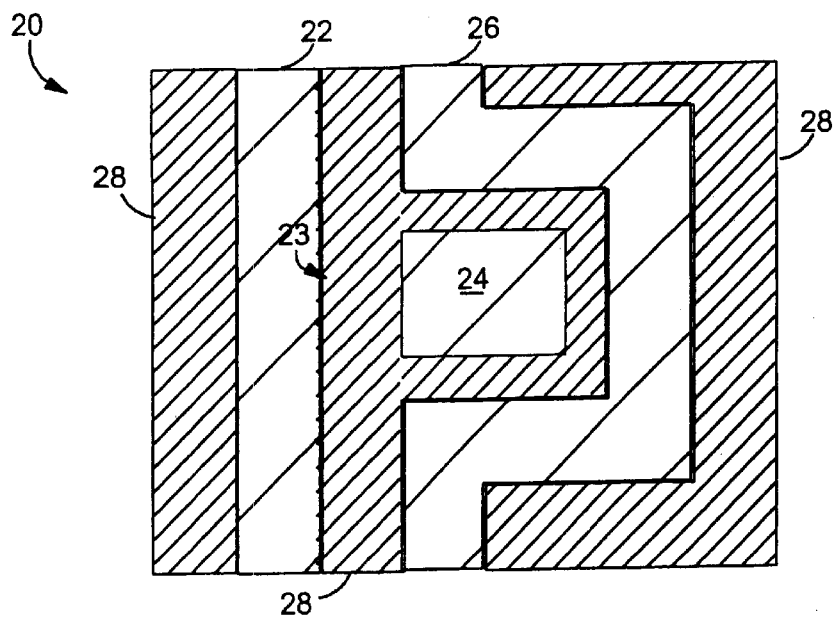
FIG. 2 is a top view of an exemplary phase-shifting mask illustrating phase conflict.

Referring to FIG. 2, a top view of a conventional phase shifting mask 20 illustrates a phase shift area 22, a phase shift area 24, and a phase shift area 26. Phase shift area 22, phase shift area 24, and phase shift area 26 are separated by portions of a chrome layer 28. As described with reference to FIGS. 4–5 below, phase shift area 22, phase shift area 24, and phase shift area 26 are defined by removed portions of chrome layer 28, exposing portions of a quartz layer.

In an exemplary embodiment, phase shift area 22 and phase shift area 24 have a phase shift characteristic of phase 0° and phase shift area 26 has a phase shift characteristic of phase 180°. Phase shift area 22 and phase shift area 24 are separated only by a small area 23 of chrome in chrome layer 28. In an exemplary embodiment, small area 23 is a distance of 0.16 $\mu$m separating phase shift area 22 and phase shift area 24. The separation distance used is dependent on the design rule employed for a specific integrated circuit design. This small distance results in a potential phase conflict where bridging may occur with respect to the light waves passing through phase shift area 22 and phase shift area 24. As discussed above, phase conflict results in less accurate lithographic operations using phase shifting mask 20.

Figure 3:
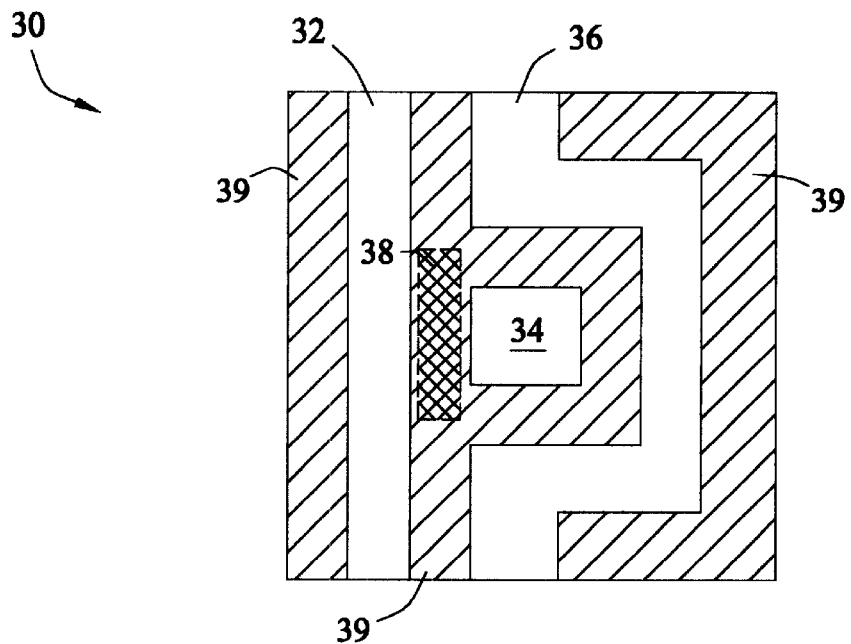
FIG. 3 is a top view of an exemplary phase-shifting mask in accordance with an exemplary embodiment.

FIG. 3 illustrates a top view of a phase shifting mask 30. Phase shifting mask 30 can include a phase shift area 32, a phase shift area 34, a phase shift area 36, and a phase attenuating segment 38. Phase shift area 32, phase shift area 34, and phase shift area 36 are defined by removed portions of a chrome layer 39. Layer 39 can be chrome oxide or other absorbing opaque material. Removed portions of chrome layer 39 expose portions of a quartz layer described further with reference to FIGS. 5–12 below.

In an exemplary embodiment, phase shift area 32 and phase shift area 34 have a phase shift characteristic of phase 0° and phase shift area 36 has a phase shift characteristic of phase 180°. Phase attenuating segment 38 is located on top of chrome layer 39 between phase shift area 32 and phase shift area 34 in order to prevent phase conflict. Phase attenuating segment 38 can be a high transmittance attenuating material. In an exemplary embodiment, phase attenuating segment 38 is made of a molybdenum silicon (MoSi) material.

Advantageously, phase attenuating segment 38 attenuates a portion of the light waves in order to prevent phase conflict between phase shift area 32 and phase shift area 34. In an exemplary embodiment, phase attenuating segment 38 attenuates 20–40% of transmitted light. Phase conflict can occur between any closely located phase shifting areas that have the same phase shift characteristic. Phase attenuating segment 38 helps to prevent any bridging in the light waves passing through phase shifting mask 30. Thus, the photo margin in this area of potential conflict is improved. The area between phase shift area 32 and phase shift area 34 where phase attenuating segment 38 is located can be called a dark field trench layer.

Figure 4:
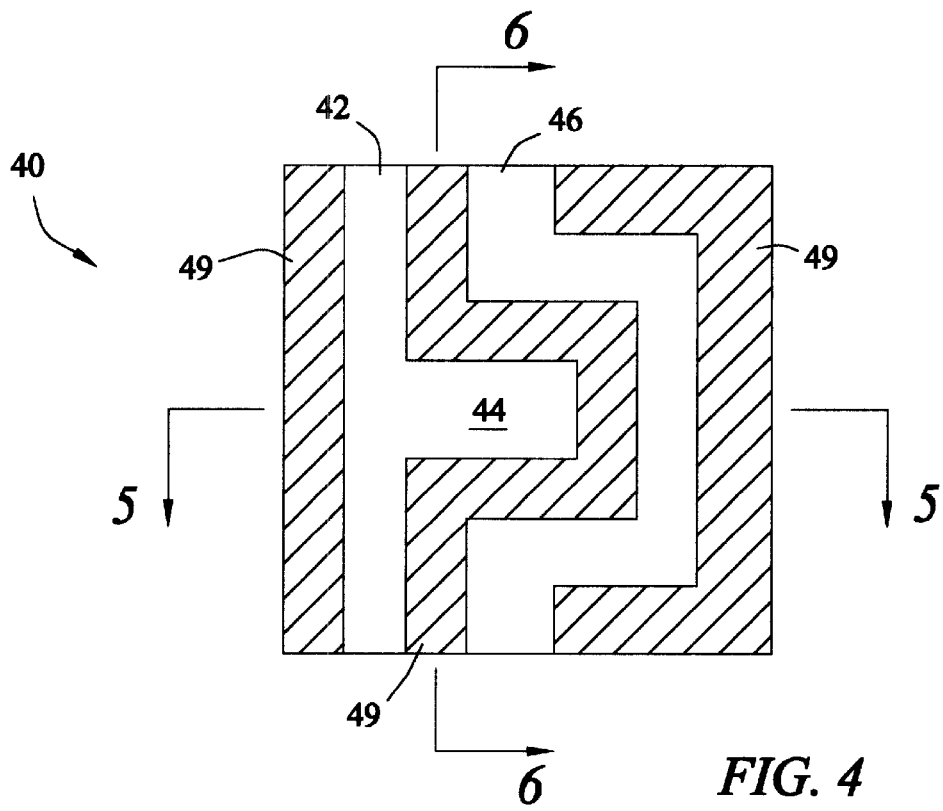
FIG. 4 is a top view of a phase-shifting mask with an area of phase conflict.

FIG. 4 illustrates a top view of a phase-shifting mask 40. Phase-shifting mask 40 can include a phase shift area 42, a phase shift area 44, and a phase shift area 46. Phase shift area 42, phase shift area 44, and phase shift area 46 are defined by removed portions of a chrome layer 49. Layer 49 can be chrome oxide or any of a variety of absorbing opaque materials.

Phase-shifting mask 40 differs from phase-shifting mask 30 described with reference to FIG. 3 in that phase shift area 42 and phase shift area 44 have merged into one area because there is a phase conflict in area 38 described with reference to FIG. 3. It is desirable to avoid phase conflict from causing this merging.

Figure 5:
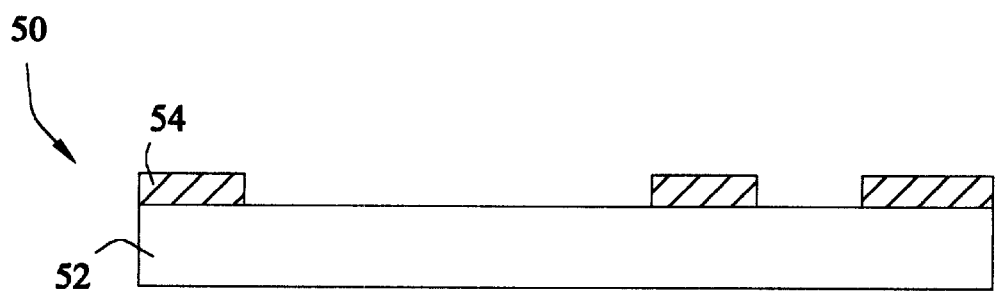
FIG. 5 is a cross-sectional view of the phase-shifting mask illustrated in FIG. 4 about the line 4—4.
Figure 6:
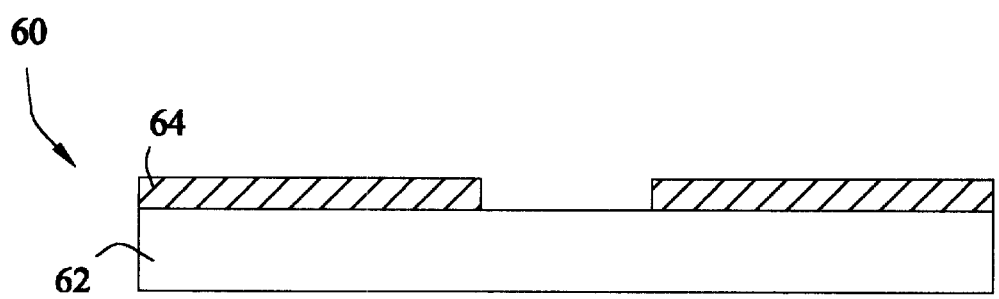
FIG. 6 is a cross-sectional view of the phase-shifting mask illustrated in FIG. 4 about the line 5—5.

FIG. 5 illustrates a cross-sectional view of a portion 50 of phase-shifting mask 40 described with reference to FIG. 4. Portion 50 includes a quartz layer 52 and a chrome layer 54. FIG. 6 illustrates a cross-sectional view of a portion 60 of phase-shifting mask 40 described with reference to FIG. 4. Portion 60 is shown in a cross-sectional view about line 5—5 in FIG. 4. Portion 60 includes a quartz layer 62 and a chrome layer 64.

Figure 7:
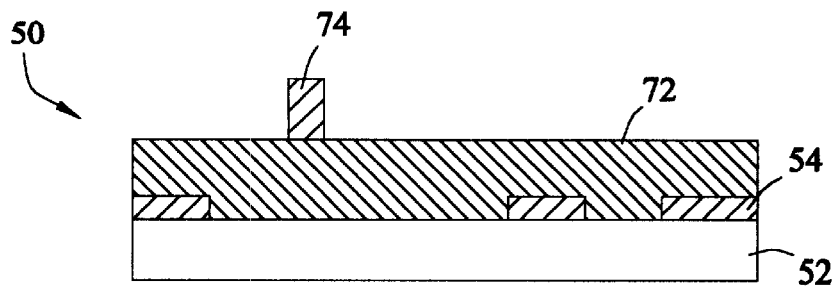
FIG. 7 is a cross-sectional view of the phase-shifting mask of FIG. 3 about the line 4—4, illustrating a phase shifting material deposition step in an exemplary method of making the phase-shifting mask.

FIG. 7 illustrates an exemplary step in a method of making phase-shifting mask 30 described with reference to FIG. 3. In an exemplary embodiment, a layer of molybdenum silicon (MoSi) or any other phase shifting material is deposited over chrome layer 54 and quartz layer 52 of portion 50 described with reference to FIG. 5. Phase shifting material layer 72 is coated with an e-beam resist or a photoresist and patterned to form a photoresist feature 74. A variety of machines may be employed to provide a coating of e-beam resist, such as, ETCT's MEBES-4500 or MEBES-X, Toshiba EBM-3500, and JEOL JBX-9000MV. Alternatively, photoresist may be deposited utilizing a machine, such as, an optical machine such as ETCT's ALTA-3700. In an exemplary embodiment, phase shifting material layer 72 is etched using photoresist feature 74 as a pattern and the resist layer is stripped, forming a phase shifting material feature 82 illustrated in FIG. 8.

Figure 8:
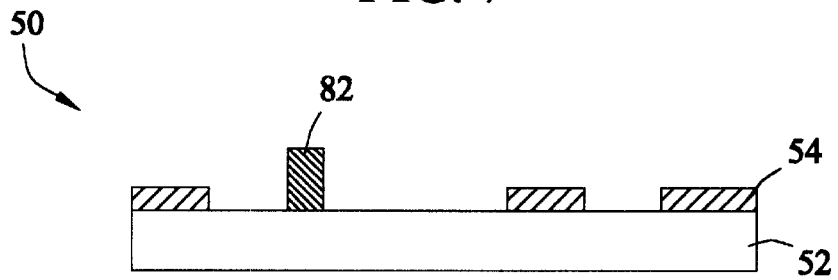
FIG. 8 is a cross-sectional view of the phase-shifting mask of FIG. 3 about the line 4—4, illustrating an etching step in an exemplary method of making a phase-shifting mask.
Figure 9:
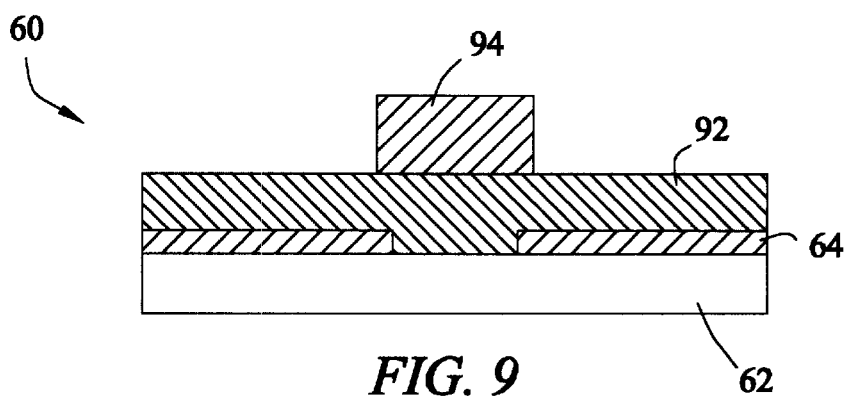
FIG. 9 is a cross-sectional view of the phase-shifting mask of FIG. 3 about line 5—5, illustrating a phase shifting material deposition step in an exemplary method of making a phase shifting mask.
Figure 10:
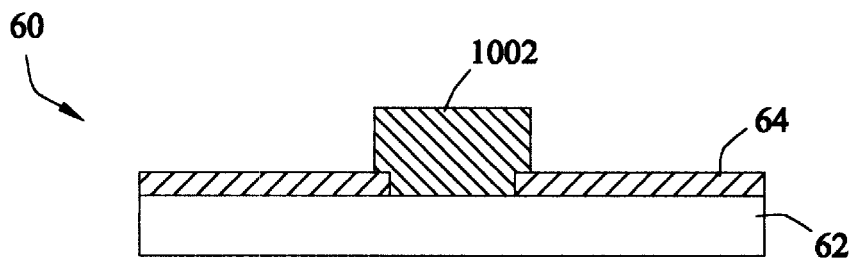
FIG. 10 is a cross-sectional view of the phase-shifting mask of FIG. 3 about line 5—5, illustrating an etching step in an exemplary method of making a phase-shifting mask.

FIG. 9 illustrates an exemplary step and a method of making phase-shifting mask 30 described with reference to FIG. 3. FIG. 9 illustrates portion 60 described with reference to FIG. 6 as a cross-sectional view about line 5—5 in FIG. 3. In an exemplary embodiment, a phase shifting material layer 92 is deposited over chrome layer 64 and quartz layer 62. A resist feature 94 is formed over phase shifting material layer 92 to pattern phase shifting material 92. Any of a variety of techniques may be utilized to pattern phase shifting material 92. FIG. 10 illustrates portion 60 after a patterning step is performed to form a phase shifting material feature 1002. FIGS. 9 and 10 illustrate the same steps as shown in FIGS. 7 and 8. Phase shifting material feature 82 described with reference to FIG. 8 and phase shifting material feature 1002 described with reference to FIG. 10 correspond to phase attenuating segment 38 described with reference to FIG. 3.

Figure 11:
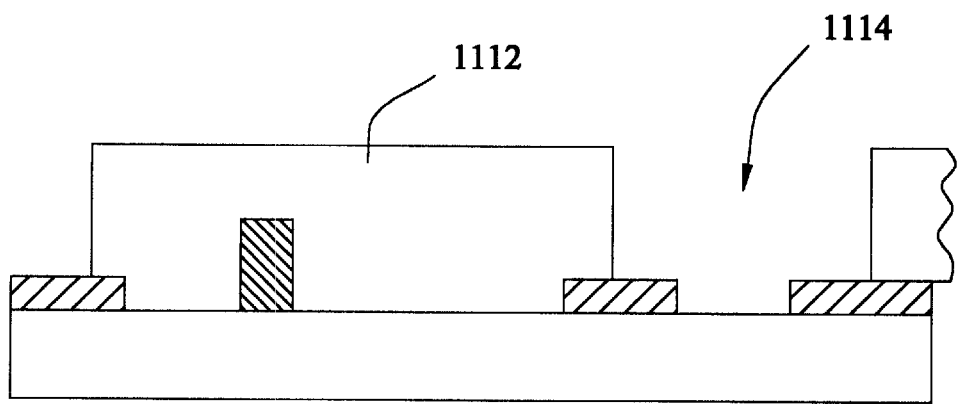
FIG. 11 is a cross-sectional view of the phase-shifting mask of FIG. 3 about line 4—4, illustrating a 180 degree phase area formation step.
Figure 12:
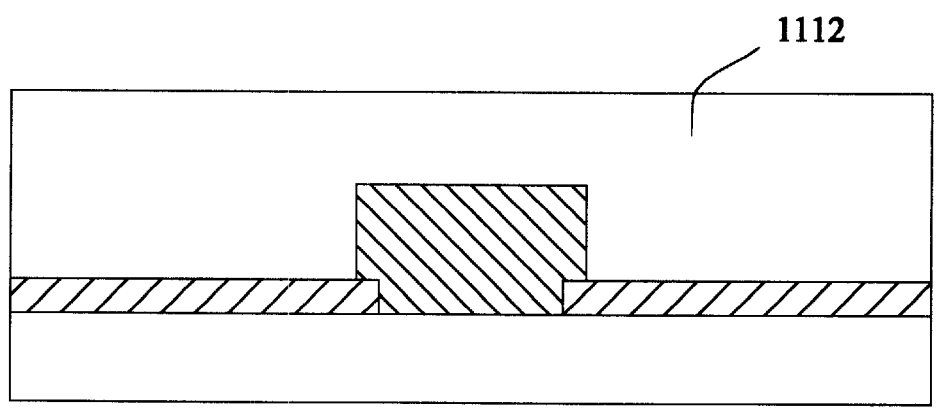
FIG. 12 is a cross-sectional view of the phase-shifting mask of FIG. 3 about line 5—5, illustrating a 180 degree phase area formation step.

FIG. 11 illustrates an exemplary step in formation of a 180 degree phase area in a phase-shifting mask. In an exemplary embodiment, an e-beam resist or photoresist layer 1112 is deposited and patterned selectively in order to expose a portion 1114. FIG. 12 also illustrates deposition of photoresist layer 1112. Exposed portion 1114 is then subjected to an etching or removal process to form a trench in the quartz layer. Such a trench results in a phase shifting.

Figure 13:
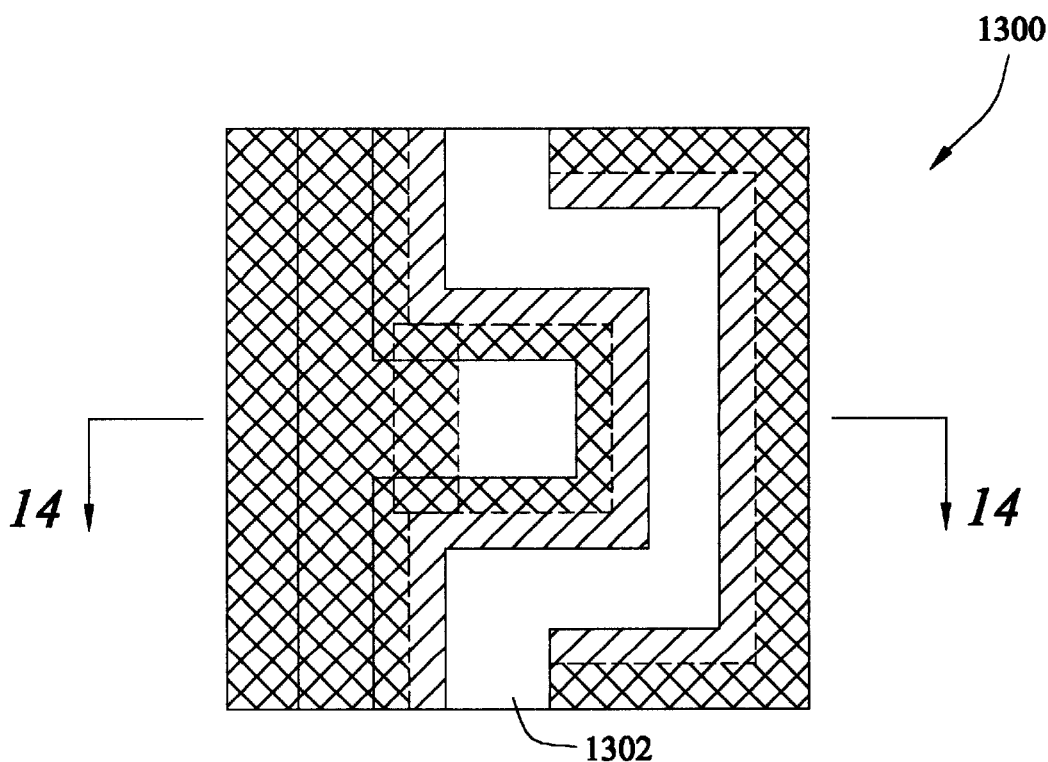
FIG. 13 is a top view of an exemplary phase-shifting mask having a 180 degree phase area.
Figure 14:
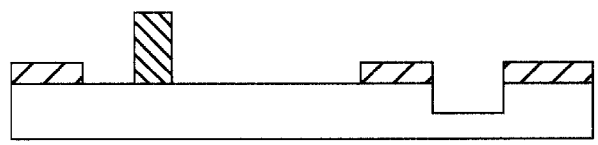
FIG. 14 is a cross-sectional view of the phase-shifting mask of FIG. 13 about line 6—6 after an etching step.

FIG. 13 illustrates a phase-shifting mask 1300. Phase-shifting mask 1300 is similar to phase-shifting mask 30 described with reference to FIG. 3 with the exception that all of phase-shifting mask 1300 except portion 1302 is covered by photoresist layer 1112 described with reference to FIGS. 11 and 12. FIG. 14 illustrates an etching step performed in which portion 1302 of phase-shifting mask 1300 described with reference to FIG. 13 is etched to form a phase 180 degree area.

While the embodiments illustrated in the FIGURES and described above are presently preferred, it should be understood that these embodiments are offered by way of example only. The invention is not limited to a particular embodiment, but extends to various modifications, combinations, and permutations that nevertheless fall within the scope and spirit of the appended claims.

What is claimed is:

1. A photoresist mask used in the fabrication of an integrated circuit, the mask comprising:
    a first portion having a phase characteristic;
    a second portion being located proximate the first portion and having the same phase characteristic as the first portion; and
    a segment of molybdenum silicon (MoSi) that attenuates about 20–40% of a transmitted light, the segment being disposed between the first portion and the second portion to prevent phase conflict between the first portion and the second portion.

2. The mask of claim 1, wherein the phase characteristic of the first portion is zero (0) degrees.

3. The mask of claim 1, wherein the segment disposed between the first portion and the second portion is disposed above a layer of chrome with apertures defining the first and second portions.

4. The mask of claim 1, wherein the first portion and the second portion are separated by a distance of less than 0.15 $\mu$m.

5. The mask of claim 1, wherein the first portion and the second portion are trenches in an opaque layer.

6. The mask of claim 5, wherein the opaque layer comprises a chrome material.

7. A photoresist mask configured for use in the integrated circuit fabrication process, the mask being made by a method comprising:
    depositing a phase shift material over an opaque layer, the phase shift material including Molybdenum silicon (MoSi) that attenuates about 20–40% of a transmitted light; and
    selectively removing the phase shift material except at a location between two phase shift mask portions having the same phase characteristic.

8. The method of claim 7, further comprising depositing a layer of chrome over a layer of quartz.

9. The method of claim 8, further comprising selectively removing portions of the layer of chrome to form at least two phase shift mask portions.

10. The method of claim 7, wherein the opaque layer comprises chrome (Cr).

11. The method of claim 7, wherein the two phase shift mask portions having the same phase characteristic are located a distance of less than 0.15 $\mu$m apart from each other.

12. The method of claim 7, further comprising patterning the phase shift material using an e-beam resist.

13. The method of claim 7, further comprising patterning the phase shift material using an optical machine.

14. A phase shifting mask comprising:
    a first section with an alternating phase shift characteristic;
    a second section being proximate to the first section, the second section having the same alternating phase shift characteristic as the first section, a potential phase conflict section being located between the first section and the second section; and
    a third section with a high transmittance attenuating phase shift characteristic being formed at the location of the potential phase conflict section, the third section including Molybdenum silicon (MoSi) that attenuates about 20–40% of a transmitted light.

15. The phase shifting mask of claim 14, wherein the alternating phase shift characteristic is zero degrees.

16. The phase shifting mask of claim 14, wherein the first section and the second section are defined by trenches in an opaque layer.

17. The phase shifting mask of claim 16, wherein the opaque layer comprises chrome.

18. The phase shifting mask of claim 14, wherein the third section has a thickness of lambda/2(n−1) where Lambda is the wavelength of a stepper tool and n is the refraction index of phase material.

19. The phase shifting mask of claim 14, wherein the distance between the first section and the second section is less than about 0.15 μm.

20. The phase shifting mask of claim 14, wherein the third section is patterned using an e-beam resist.

* * * * *